(12) United States Patent
Pasotti et al.

(10) Patent No.: US 6,687,159 B2
(45) Date of Patent: Feb. 3, 2004

(54) METHOD OF PROGRAMMING A PLURALITY OF MEMORY CELLS CONNECTED IN PARALLEL, AND A PROGRAMMING CIRCUIT THEREFOR

(75) Inventors: Marco Pasotti, S. Martino Sicc. (IT); Giovanni Guaitini, Trecella (IT); Guido De Sandre, Brugherio (IT); David Iezzi, Osnago (IT); Marco Poles, Ghedi (IT); Pierluigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 68 days.

(21) Appl. No.: 10/036,337

(22) Filed: Dec. 19, 2001

(65) Prior Publication Data

US 2002/0105835 A1 Aug. 8, 2002

(30) Foreign Application Priority Data

Dec. 22, 2000 (IT) ...................................... MI2000A2807

(51) Int. Cl.[7] .............................................. G11C 16/04
(52) U.S. Cl. ............................. 365/185.18; 365/185.19; 365/189.09

(58) Field of Search ........................ 365/185.28, 185.3, 365/185.18, 185.19, 189.09

(56) References Cited

U.S. PATENT DOCUMENTS 4,797,856 A * 1/1989 Lee et al. ................ 365/185.3
6,111,791 A * 8/2000 Ghilardelli ............. 365/185.28

* cited by examiner

*Primary Examiner*—Vu A. Le
(74) *Attorney, Agent, or Firm*—Lisa K. Jorgenson; E. Russell Tarleton; Seed IP Law Group PLLC

(57) ABSTRACT

A method of programming a plurality of memory cells are connected in parallel between first and second supply references and having their gate terminals connected together and, through row decoding means, also connected to an output terminal of an operational amplifier that is adapted to generate a word voltage signal, the first voltage reference being provided by a charge pump circuit. The programming method uses a program loop that includes the cells to be programmed and the operational amplifier, the charge pump circuit thus outputting a voltage ramp whose slope is a function of the cell demand. A programming circuit adapted to implement the method is also provided.

30 Claims, 6 Drawing Sheets

METHOD OF PROGRAMMING A PLURALITY OF MEMORY CELLS CONNECTED IN PARALLEL, AND A PROGRAMMING CIRCUIT THEREFOR

BACKGROUND OF THE INVENTION

1. Field of the Invention

The present invention relates to a method of programming a plurality of memory cells connected in parallel, and more particularly to a circuit for programming a plurality of memory cells, which memory cells are connected, through column decoder means, to a program voltage reference provided by a charge pump circuit, and to a second voltage reference, and which have their gate terminals connected together and to a word line, and in addition to a method and a circuit for programming Flash memory cells, the detailed description hereinafter covering this field of application for convenience of explanation only.

2. Description of the Related Art

As is well known, one of the modes for programming a flash memory cell involves use of a circuit adapted to generate a voltage ramp on the cell gate terminal.

At steady state, the value of the threshold voltage of a cell follows the ramp slope and is accompanied by a degree of overdrive due to the varying demand for voltage from individual cells with respect to the voltage provided by the circuit, while the demand for current at the drain terminal of the cell remains constant.

Setting the slope of the voltage ramp also sets the current demand from the individual cells. All the above restrains, however, the number of cells that can be programmed in parallel.

In particular, the voltage to be applied to the drain terminal of a cell is provided by a suitable charge pump circuit which, due to area and power restrictions, can only supply a limited amount of current (a few mA) reflecting on a maximum number of cells that can be programmed in parallel.

In order to program a larger number of cells than the maximum allowed by the charge pump circuit capabilities, it has been common practice to complete the programming operation as two distinct steps, namely:

a first step, in which a number of cells equal to the allowed maximum are programmed; and a second step, in which the surplus cells are programmed.

In practice, the second programming step has an inefficiency in that the charge pump circuit is potentially capable of supplying a much larger current than that used by the surplus cells, the number of these cells being smaller than the maximum number of programmable cells for which the charge pump circuit has been set.

Also, the time required for splitting the operation into the two steps delays the programming operation.

BRIEF SUMMARY OF THE INVENTION

An embodiment of the invention is directed to a memory cell programming method whereby the use of a suitable charge pump circuit can be optimized and the shortcomings of prior programming methods overcome.

The memory cell programming method provides for automatically adjusting the slope of the voltage ramp applied to the memory cells to suit load demand, using a loop system that includes the cells to be programmed.

The method of programming a plurality of memory cells connected in parallel between first and second supply references and having their gate terminals connected together and, through row decoding means, also connected to an output terminal of an operational amplifier adapted to generate a word voltage signal, said first voltage reference being provided by a charge pump circuit, uses a program loop that includes said cells to be programmed and said operational amplifier, such that said charge pump circuit will output a voltage ramp whose slope is a function of the cell demand.

Another embodiment is directed to a circuit for programming a plurality of memory cells connected, through a plurality of column decode switches, to a program voltage reference provided by a charge pump circuit, and connected to a second voltage reference, with the cell gate terminals sharing connection to a word line, the circuit comprising an operational amplifier having a first input terminal connected to said program voltage reference, a second input terminal connected to an external voltage reference, and an output terminal connected, through an additional row switch, to said word line to provide a word voltage signal, said operational amplifier being, together with said cells, connected in a program loop able to adjust the slope of an output voltage ramp from said charge pump circuit to suit the cell demand.

BRIEF DESCRIPTION OF THE SEVERAL VIEWS OF THE DRAWING(S)

The features and advantages of the programming method and circuit according to the disclosed embodiments of this invention will be apparent from the following detailed description of an embodiment thereof, given by way of non-limitative example with reference to the accompanying drawings.

DETAILED DESCRIPTION OF THE INVENTION

Figure 1:
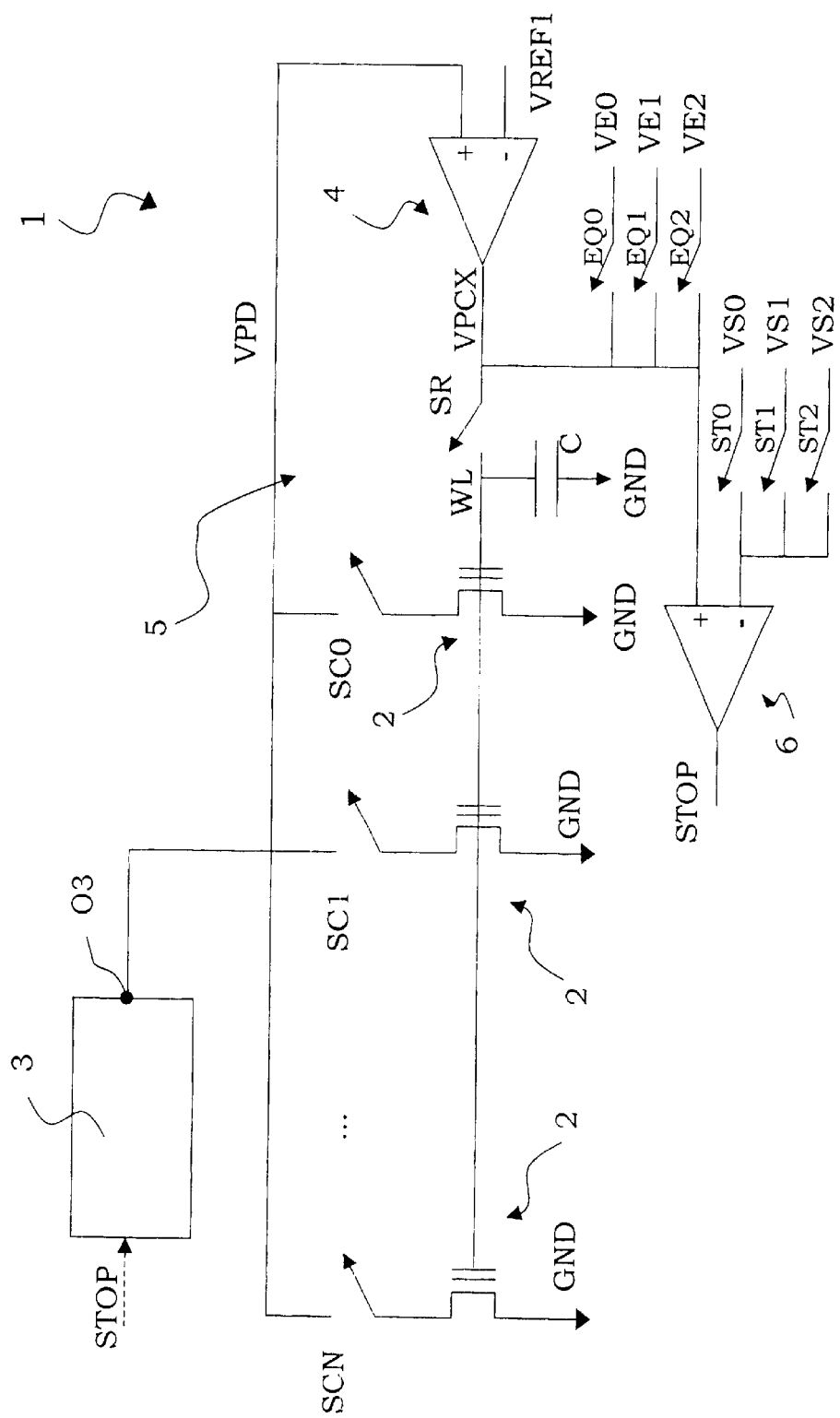
FIG. 1 shows schematically a circuit for programming Flash memory cells, which circuit implements the cell programming method according to an embodiment of the invention.

Shown generally in FIG. 1 is a schematic view of a memory cell programming circuit 1 implementing the method according to an embodiment of the invention.

The cell programming circuit 1 comprises a plurality of memory cells 2, for instance of the Flash type. These cells 2 may be located in one row of a memory array of such cells conventionally organized as rows and columns.

Advantageously according to an embodiment of the invention, the cells 2 are connected between a first voltage reference, e.g., a program voltage VPD, through a plurality of switches SC0, . . . , SCN and a second voltage reference, e.g., a ground GND. The switches SC0, . . . , SCN correspond to appropriate column decode means and allow the cells 2 to be connected in parallel to the program voltage reference VPD when said cells are to be programmed. Moreover, the cells 2 have their gate terminals connected together and to a word line WL, the latter being further connected to ground GND through a capacitor C.

The cell programming circuit 1 further comprises a charge pump circuit 3 having an output terminal O3 directly connected to the program voltage reference VPD, and comprises an operational amplifier 4 having a first or non-inverting (+) input terminal connected to said program voltage reference VPD, a second or inverting (−) input terminal connected to a fixed external voltage reference VREF, and an output terminal connected, through an additional row-enable switch SR corresponding to suitable row decode means, to said word line WL and providing a word voltage signal VPCX to be applied to the gate terminals of the cells 2 in the closed or OFF state of the row-enable switch SR.

Furthermore, the output terminal of the operational amplifier 4 is equalized to suitable voltages (VE0, VE1, VE2) by means of equalization switches EQ0, EQ1, EQ2 connected to it. In particular, the equalization voltages VE0, VE1, VE2 are applied to the output terminal of the operational amplifier 4 to assist its charging the capacitor C of the word line WL.

In a preferred embodiment of the invention, the equalization voltages are determined by trial-and-error as:

$$VE0=2.5V\ VE1=5.5V\ VE2=7.5V.$$

Moreover, the fixed external voltage reference VREF is set at 4.5 V, corresponding to the steady-state value for the program voltage reference VPD.

It should be noted that the cells 2, connected to the program voltage reference VPD and the operational amplifier 4, jointly define a program loop 5 of the program circuit 1.

Advantageously according to an embodiment of the invention, the cell programming circuit 1 further comprises a comparator 6 having a first or non-inverting (+) input terminal connected to the output terminal of the operational amplifier 4, a second or inverting (−) input terminal connected to a plurality of voltage references (VS0, VS1, VS2) adapted to be selected by means of a plurality of selection switches ST0, ST1, ST2, as well as to an output terminal providing a program interrupt signal STOP.

In particular, the comparator 6 compares the word voltage signal VPCX with these selectable voltage references. Also, the program interrupt signal STOP acts on the charge pump circuit 3 through suitable circuitry (not shown because conventional).

In a preferred embodiment of the invention, the values of the selectable voltages (VS0, VS1, VS2) would be the following:

$$VS0=5.5V\ VS1=6.5V\ VS2=7.5V.$$

The operation of the program circuit 1 according to an embodiment of the invention will now be described.

Leaving aside the functions of the equalization switches (EQ0, EQ1, EQ2), it should be noted that, upon the program loop 5 being closed, the program voltage reference VPD equals 4.5 V at steady-state. In other words, the voltage ramp of the charge pump circuit 3 is adjusted such that the gate terminals of the cells 2 will attain a predetermined voltage value. Also, the current from the charge pump circuit 3 is always the same, irrespective of the number of cells 2 that are connected in the program loop 5.

With the cells 2 being programmed, the values of their threshold voltages Vth begin to rise, thereby decreasing the voltage overdrive of each cell 2. Advantageously according to an embodiment of the invention, the value of the word voltage signal VPCX is also increased to hold the program loop 5 closed.

In particular, the cells 2 have initially different threshold voltages, and hence, different programming rates. Advantageously in the cell programming circuit I according to the invention, cells 2 having lower thresholds than the others and/or more efficiently programmed cells 2 rise first with their threshold voltages, at a faster rate, thereby reducing their overdrive with respect to the others and reducing their write speed as well. At steady state, therefore, a balanced condition prevails with each cell 2 at a suitable overdrive value to cause the threshold value to change at the same rate. From now onwards, in each cell 2 will flow a constant current.

Figure 2:
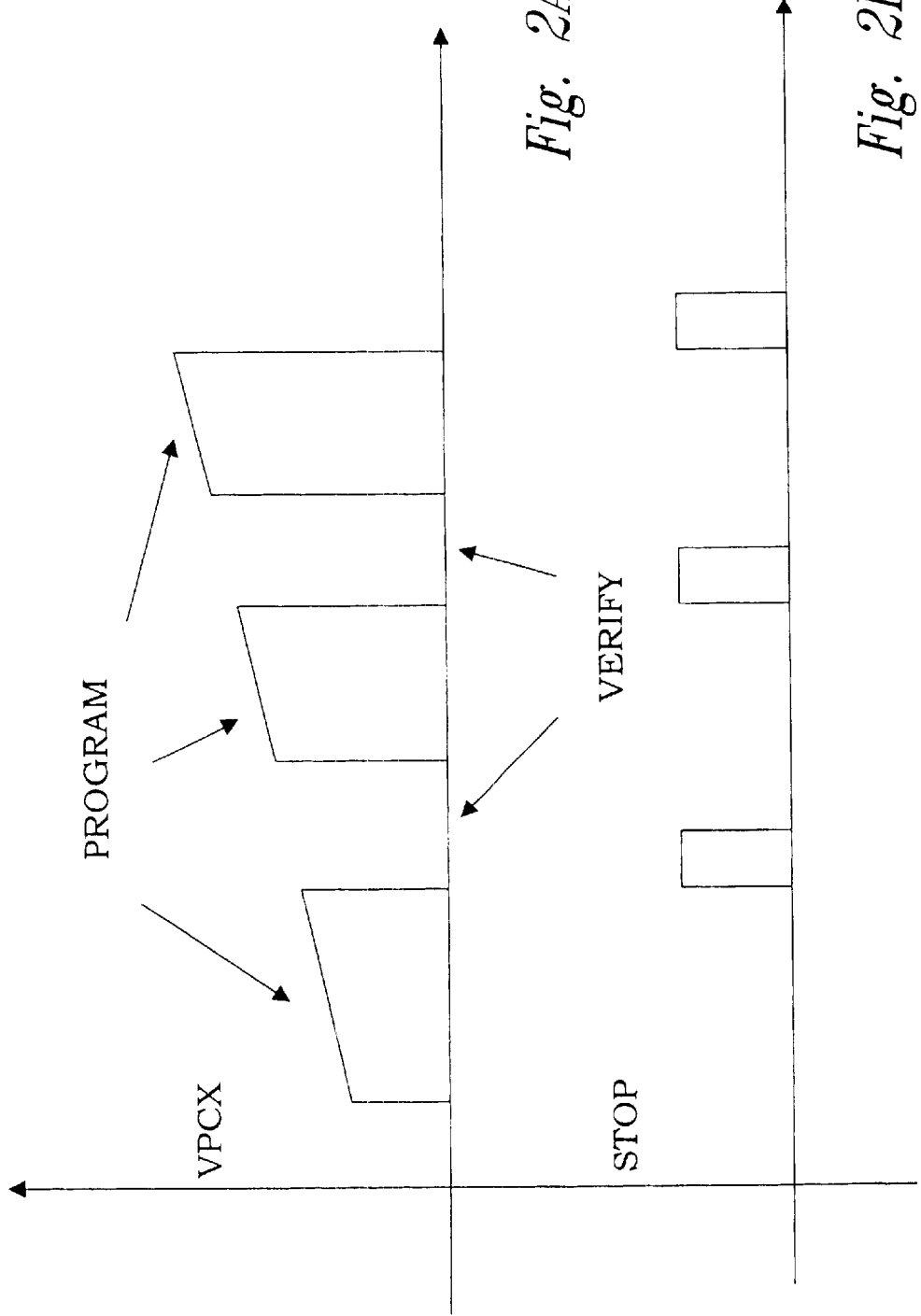
FIGS. 2A and 2B are plots of internal signals of the cell programming circuit shown in FIG. 1.

The voltage at the gate terminals of all the cells 2 in the program loop 5, i.e., the word voltage signal VPCX, will then follow a ramp pattern at a constant overdrive, as shown schematically in FIG. 2A, where the sloping segments of the word voltage signal VPCX correspond to the cell programming step [PROGRAM] and the lapses between them correspond to the next verifying step [VERIFY].

The ramp slope will depend on the number of cells 2 to be programmed, the current of the charge pump circuit 3 being divided between the cells to be programmed.

Thus, when the number of cells to be programmed is large, current per cell is small, the required overdrive is also small, the programming rate is slow, and so the slope of the word voltage signal VPCX becomes small. The reverse situation would occur when the number of cells to be programmed is small.

In the program circuit 1 according to an embodiment of the invention, moreover, an amplifier is employed as the operational amplifier 4 whose slew rate attains its maximum at the maximum admissible slope for the word voltage signal VPCX.

The object of this is to prevent, when only very few cells are to be programmed, the occurrence of a very fast voltage ramp upon the program loop 5 being closed, such that the actual threshold voltages of the cells would be unable to follow. In this case, the word voltage signal VPCX would attain its maximum value and the threshold voltages rise uncontrollably, substantially in an open loop, resulting in loss of programming accuracy.

It should be noted that to stop the programming step, no comparable effects could be obtained by providing a comparator connected to the word voltage signal VPCX. In this case, the interrupt signal STOP would be issued at a value of the threshold voltages Vth approximately equal to the value of the word voltage signal VPCX that produces the interrupt less the cell overdrives. Accordingly, excessively large cell overdrives would cause the interrupt signal STOP to be issued far in advance of the proper time, resulting in the cells being underprogrammed.

Furthermore, if the program loop 5 closes untimely, the program voltage reference VPD would rise above a maximum value and stress the drain junctions in other cells.

Finally, to obtain a less sharp closing phase of the program loop 5, and to avoid instant overvoltages on the program voltage reference VPD and the word voltage signal VPCX, the charge pump circuit 3 could be turned on more gradually. Likewise, the supply voltage values of the operational amplifier 4, or its fixed external voltage reference VREF, could be increased gradually for the same result.

Figure 3:
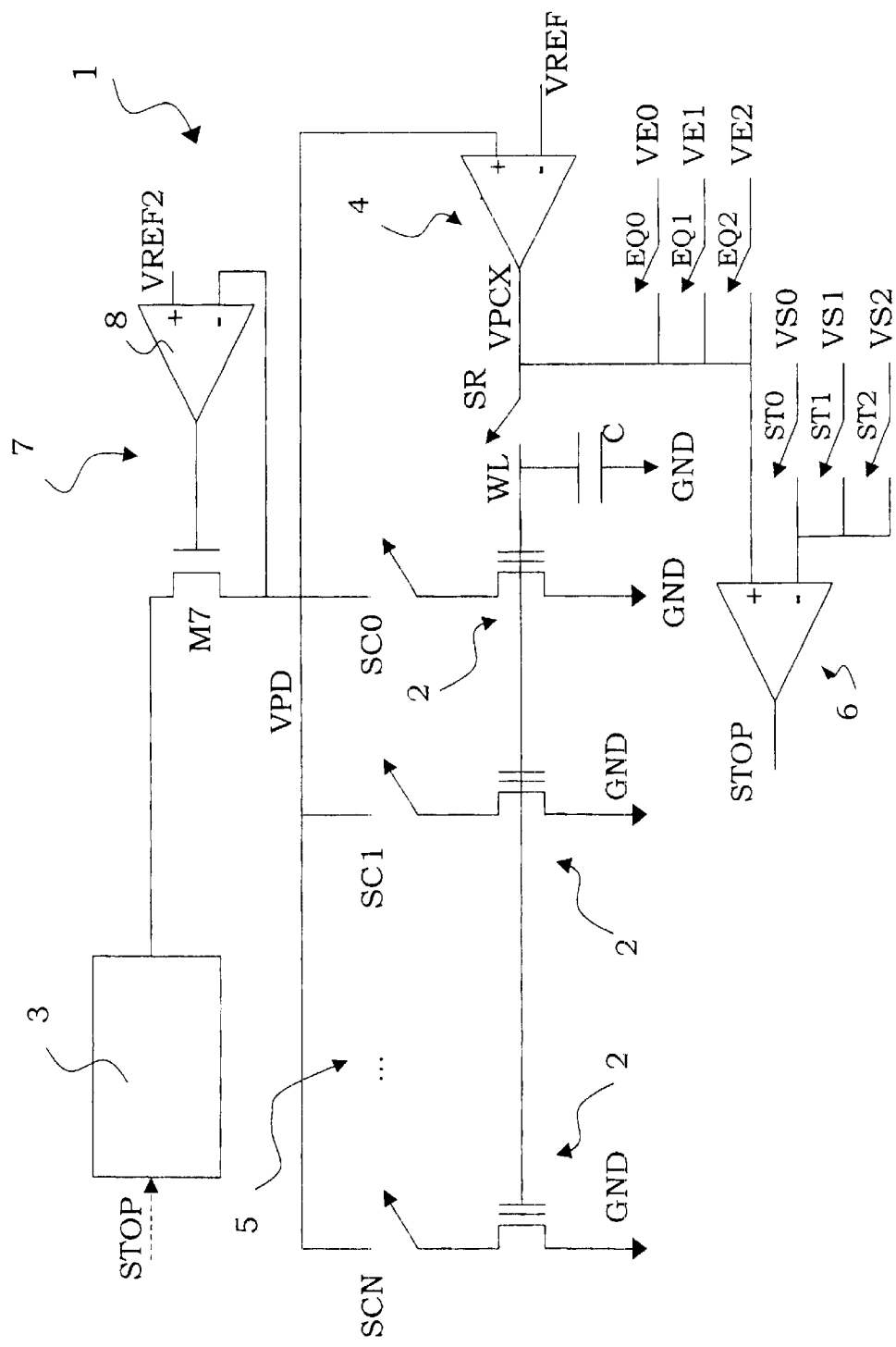
FIG. 3 shows schematically a further embodiment of the cell programming circuit of FIG. 1.

In a first embodiment shown schematically in FIG. 3, the program circuit 1 further comprises a limiter circuit 7, connected between the output terminal O3 of the charge pump circuit 3 and the program voltage reference VPD.

In particular, the limiter circuit 7 comprises a MOS transistor M7, connected between the output terminal O3 of the charge pump circuit 3 and the program voltage reference VPD, and an additional operational amplifier 8; the latter having a first or inverting (−) input terminal connected to the program voltage reference VPD, a second or non-inverting (+) input terminal connected to a second fixed external voltage reference VREF2, and an output terminal connected to the gate terminal of transistor M7.

In a preferred embodiment of the invention, the second fixed external voltage reference VREF2 is set at 4.8 V, i.e., at a value slightly above the steady-state value of the program voltage reference VPD.

When the program voltage reference VPD tends to rise above the second fixed external voltage reference VREF2, the additional operational amplifier 8, which is normally in the saturated state, acts to limit the program voltage reference VPD through the MOS transistor M7. In this situation, the operational amplifier 4 would be unable to close the program loop 5 indeed.

Advantageously according to this embodiment of the invention, the limiter circuit 7 will limit the stress imposed on the drain terminals of the cells 2 being programmed.

Figure 4:
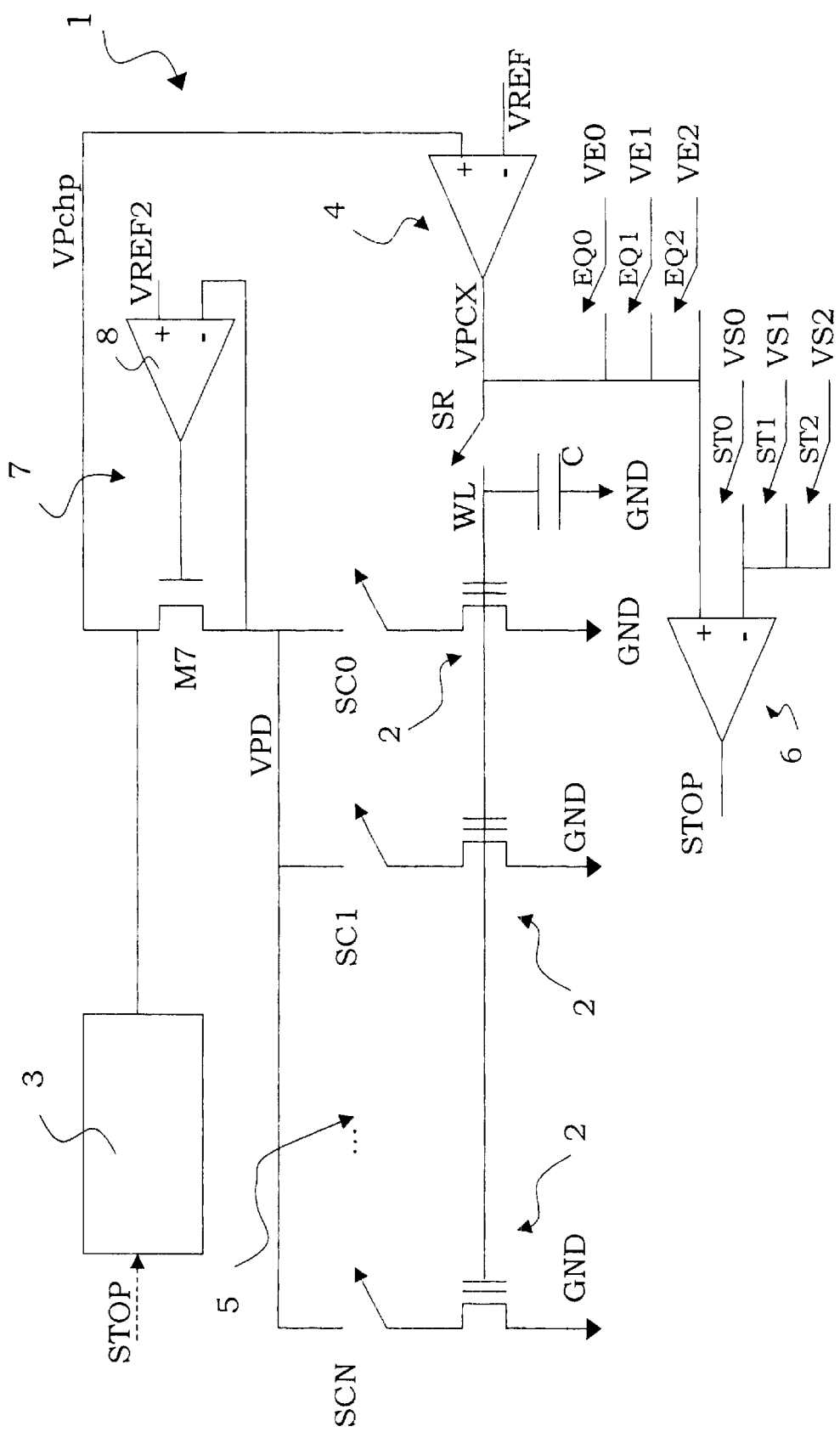
FIG. 4 shows schematically a further embodiment of the cell programming circuit of FIG. 1.

In a second embodiment, shown schematically in FIG. 4, the program circuit 1 again comprises a limiter circuit 7 as previously described in relation to the first embodiment shown in FIG. 3.

Advantageously according to this embodiment of the invention, the operational amplifier 4 has the first or non-inverting (+) input terminal connected to the output terminal of the charge pump circuit 3, whereat a charge pump voltage signal VPchp is provided, rather than to said program voltage reference VPD.

It should be noted that the program loop 5 includes the limiter circuit 7 also in the second embodiment of the program circuit 1 shown in FIG. 4.

In this way, a more stable program voltage VPD, particularly in the range of 4.8 V, is provided in the circuit transistors as well.

Figure 5:
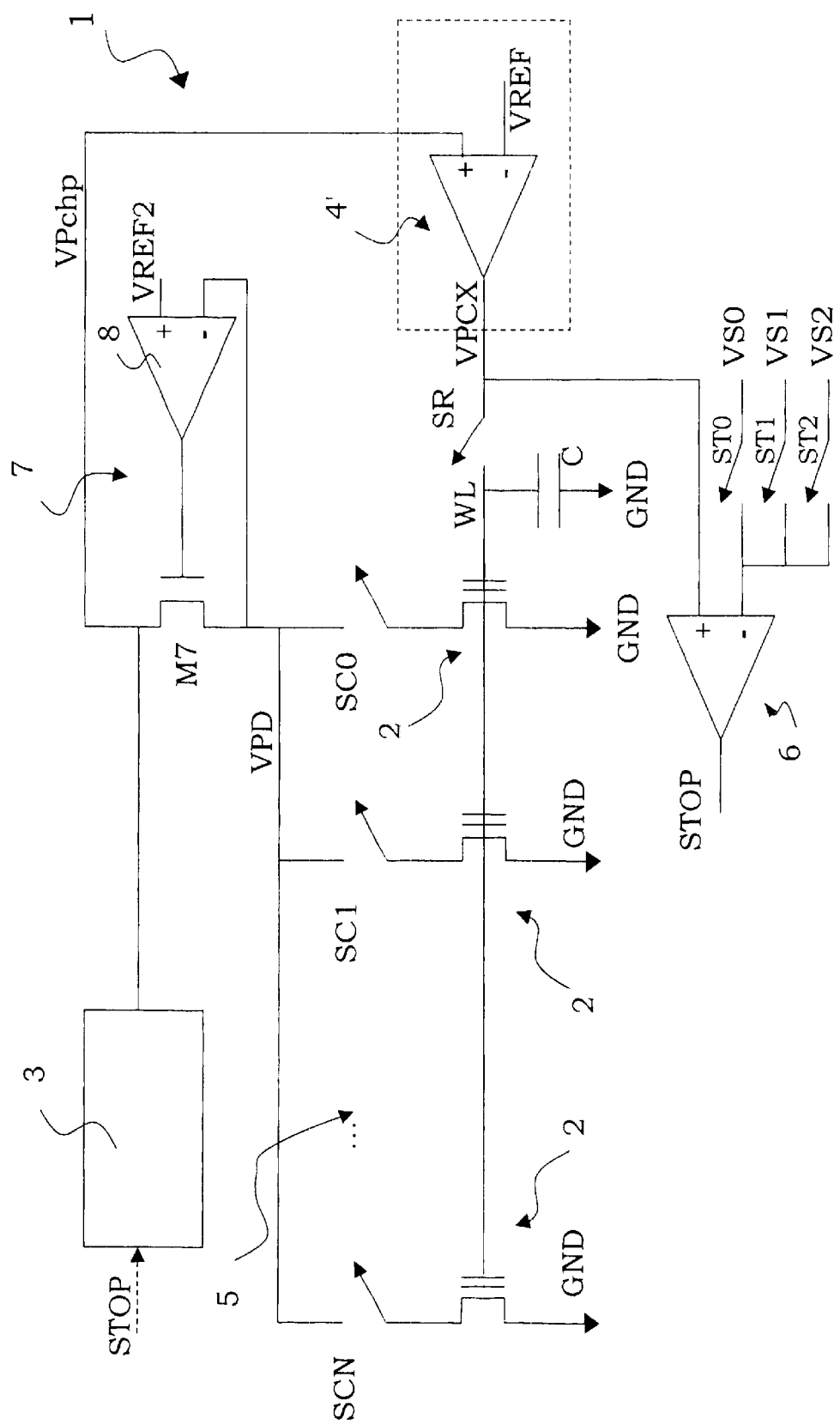
FIG. 5 shows schematically a further embodiment of the cell programming circuit of FIG. 1.

Shown in FIG. 5 is a third embodiment of the program circuit 1. In particular, the limiter circuit 7 is provided within the program loop 5 in this embodiment, as described before in relation to FIG. 4.

Advantageously according to this embodiment of the invention, with the program circuit of FIG. 5 there is no need to provide equalization switches (EQ0, EQ1, EQ2) and equalization voltages (VE0, VE1, VE2).

Figure 6:
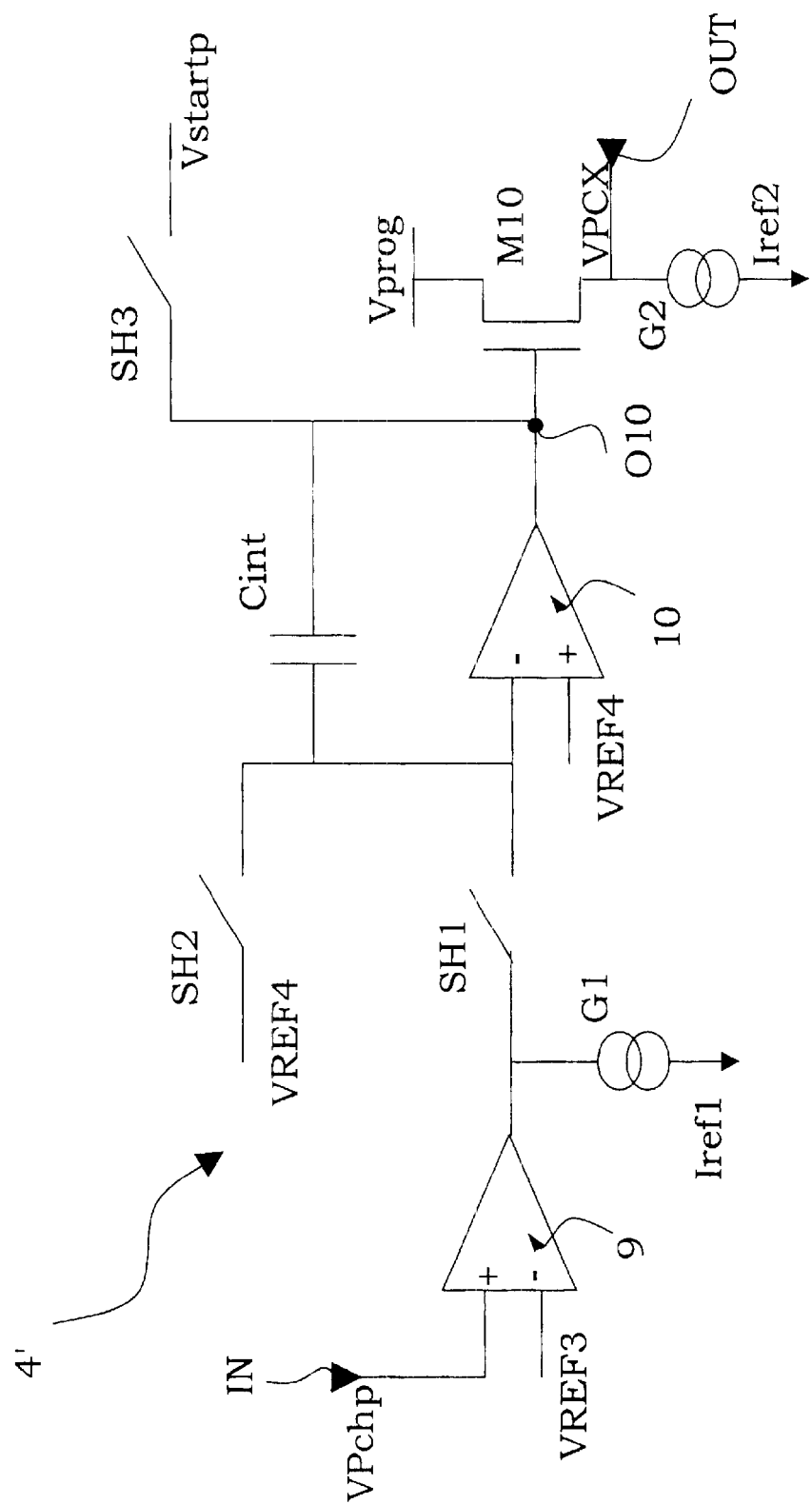
FIG. 6 is a detail view of the embodiment shown in FIG. 1.

In fact, according to this embodiment, an integrator type of operational amplifier 4' is provided as shown schematically in FIG. 6.

In particular, the operational amplifier 4' comprises a first input amplifier 9, having a first or inverting (−) input terminal connected to a first fixed voltage reference VREF3, a second or non-inverting (+) input terminal connected to an input terminal IN of the operational amplifier 4' to receive the charge pump voltage signal VPchp, and an output terminal connected to a first generator G1 of a first reference current Iref1, and connected to a first or inverting (−) input terminal of a second amplifier 10 through a first switch SH1.

The amplifier 10 has a second or non-inverting (+) input terminal connected to an internal voltage reference VREF4, and has an output terminal O10 connected to a control terminal of a MOS transistor M10, the latter being connected between a program voltage reference Vprog and an output terminal OUT of the operational amplifier 4', itself connected to a second generator G2 of a second reference current Iref2.

The operational amplifier 4' further comprises an internal capacitive element Cint, which is feedback connected between the output terminal and the first or inverting (−) input terminal of amplifier 10.

In particular, the internal capacitive element Cint has a first end connected to the first or inverting (−) input terminal of amplifier 10 and to the internal voltage reference VREF4 through a second switch SH2, and a second end connected to the output terminal of amplifier 10 and to a program start-up reference Vstartp through a third switch SH3.

Advantageously according to an embodiment of the invention, the second amplifier 10 is a charge integrating type and produces on its output a voltage ramp that starts from the value of the program start-up reference Vstartp, this value being set in such a way that the word voltage signal VPCX is 2 V.

The value of the integrated current by the amplifier 10 equals the sum of the first reference current Iref1 and the output current from amplifier 9, so that the minimum and maximum slope values of the voltage ramp produced by the amplifier 10 are properly controlled and the whole program circuit 1 is made more stable.

The operational amplifier 4' basically comprises an initial voltage/current amplification stage (essentially comprising the amplifier 9), an intermediate charge integration stage (comprising the amplifier 10, generator G1, and internal capacitive element Cint), and a final stage of the source-follower type (essentially comprising the transistor M10 and generator G2).

It should be noted that the operational amplifier 4' according to the invention advantageously utilizes the amplifier 10 initially for an S&H (Sample and Hold) circuit, and retains the value on its output terminal. In this way, if a target threshold voltage value is not attained after a first program pulse, the next program pulse would start from the voltage value left over by the first.

No synchronizing apparatus, therefore, need be provided.

The following are the advantages of the program circuit 1 according to embodiments of the invention:

several cells can be programmed in parallel, by adopting a compromise of speed and parallelism that improves the efficiency of the programming step;

the current required for programming is automatically limited to a value equal to that of the current provided by the charge pump circuit 3, with the latter that is sized for utmost efficiency at the target value;

no voltage ramp need be applied to the gate terminals of the cells being programmed, because the ramp would form automatically upon closing the program loop 5 and the slope of the so obtained ramp is inversely proportional to the number of cells to be programmed in parallel;

the overvoltages on the cell drain terminals are limited by the limiter circuit 7; and the overvoltages on the cell gate terminals are limited by choosing suitable values for the slew rate of the operational amplifier 4.

The program circuit 1 can implement the programming method according to an embodiment of the invention, which method comprises the steps of:

(a) selecting the cells 2 to be programmed by turning on the respective switches SC0, . . . , SCN, the row-enable switch SR, a first equalization switch EQ0, and a first selection switch ST0.

In this way, the program loop 5 is closed, but the word voltage signal VPCX is forced to the first predetermined equalization voltage VE0 and assists the operational amplifier 4 in charging the capacitor C of the word line WL and reaching start point quickly.

(b) starting the cell programming by opening the equalization switch EQ0;

(c) comparing the value of the word voltage signal VPCX with the first selectable voltage reference VS0, using the comparator 6;

(d) generating the program interrupt signal STOP;

(e) starting the program verify step (not shown because conventional), which would comprise the following steps:

(e1) switching the word voltage signal VPCX of the word line WL from a program value to a read value, as by opening the row-enable switch SR and closing a verify switch;

(e2) verifying the threshold value attained by the programmed cells using suitable sense amplifiers;

(f) pulling the interrupt signal STOP to a low;

(g) at the end of the program verify step, preparing the programming step by closing the row-enable switch SR, a second equalization switch EQ1, and a second selection switch ST1;

(h) triggering on a new programming step by opening said second equalization switch EQ2.

At this point, the programming method returns to step (b) above, using the second and third equalization EQ1, EQ2 and selection ST1, ST2 switches.

In the end, all the cells 2 will be programmed.

Also, the equalization voltages VE0, VE1, VE2 and selection voltages ST0, ST1, ST2 will be marginally above the values actually attained by the threshold voltages Vth of the cells 2. In fact, during the programming step, the bulk terminals of the cells are pulled to a negative voltage value (approximately equal to −1 V), and the threshold voltage of a cell is higher when being programmed than when being read, due to a body effect.

To summarize, the programming method according to an embodiment of the invention allows the current from the charge pump circuits to be best utilized by automatically adjusting the slope of the output voltage ramp according to the load demand.

In particular, when several cells are to be programmed simultaneously, this voltage ramp becomes smaller, thereby reducing the overdrive to the individual cells.

In this way, the current drain to the individual cells is reduced at the same time as programming time is lengthened.

On the other hand, where the cells to be programmed are few, the voltage ramp becomes higher, and the overdrive to the individual cells increases, resulting in increased drain and programming speed.

Furthermore, in the method according to an embodiment of the invention, the programming operation need not be divided into any number of steps, since there is no maximum number of parallel programmable cells set beforehand.

It should be noted that a practical limit on the maximum number of cells that can be programmed does exist in that, as the programming efficiency diminishes through the use of very small overdrives, the level of efficiency becomes excessively low energy-wise.

Advantageously according to an embodiment of the invention, in consideration of the fact that the programming efficiency of a cell improves as the drain current increases, this method, in addition to being faster, is more efficient where few cells are to be programmed.

Furthermore, the charge pump circuit delivers an amount of current at all times. This allows the charge pump circuit to be designed for maximum efficiency in the nominal range of the target values.

The combined effects of the improved efficiency of the charge pump circuit and the improved average efficiency of the programming operation reflect on energy savings.

Thus, the method according to an embodiment of the invention is specially useful, for instance, to extend the life span of batteries in portable applications, but also useful in any other applications that are critical to power consumption.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A method of programming a plurality of memory cells connected in parallel between first and second supply references and having their gate terminals connected together and, through row decoding means, also connected to an output terminal of an operational amplifier adapted to generate a word voltage signal, comprising: providing said first voltage reference by a charge pump circuit that forms a program loop that includes said cells to be programmed and said operational amplifier, said charge pump circuit outputting a voltage ramp whose slope is a function of the demand from said cells.

2. The programming method of claim 1, comprising the steps of:

(a) selecting the cells to be programmed by enabling said row decode means;

(b) starting the cell programming by applying a first equalization voltage;

(c) comparing the value of said word voltage signal with a first selectable voltage reference;

(d) generating a program interrupt signal;

(e) carrying out a program verify step;

(f) pulling low said interrupt signal;

(g) at the end of said program verify step, preparing a new programming step;

(h) triggering on said new programming step; and (i) repeating the above steps from step (b) to exhaustion of said cells to be programmed.

3. The programming method of claim 2, wherein said step of applying a first equalization voltage is started by opening a first equalization switch connected to said output terminal of said operational amplifier.

4. The programming method of claim 2, wherein said comparison of the value of said word voltage signal with a first selectable voltage reference is performed by a comparator.

5. The programming method of claim 2, wherein said program interrupt signal is applied to said charge pump circuit.

6. The programming method of claim 2, wherein said preparation of a new programming step is started by the opening of a second equalization switch connected to said output terminal of said operational amplifier.

7. The programming method of claim 2, wherein said charge pump circuit provides a fixed nominal value of current and, therefore, is sized for maximum efficiency in the range of said nominal value.

8. A circuit for programming a plurality of memory cells connected, through column decode means, to a program voltage reference provided by a charge pump circuit, and connected to a second voltage reference, with the cell gate terminals sharing connection to a word line, the circuit comprising: an operational amplifier having at least one input terminal connected to an external voltage reference and an output terminal connected, through suitable row decode means, to said word line in order to provide a word voltage signal, said operational amplifier connected with said cells in a program loop arranged to adjust the slope of an output voltage ramp from said charge pump circuit to suit the demand from said cells.

9. The programming circuit of claim 8, wherein said operational amplifier has another input terminal connected to said program voltage reference.

10. The programming circuit of claim 8, further comprising suitable equalization switches connected to said output terminal of said operational amplifier to equalize said terminal to suitable voltages and assist the amplifier in charging a capacitor connected between said word line and said second voltage reference.

11. The programming circuit of claim 8, further comprising a comparator having a first input terminal connected to said output terminal of said operational amplifier, a second input terminal connected to a plurality of selectable voltage references through a plurality of selection switches, and an output terminal for supplying a program interrupt signal to said charge pump circuit.

12. The programming circuit of claim 11, wherein said comparator compares said word voltage signal with said selectable voltage references.

13. The programming circuit of claim 11, wherein the slew rate of said operational amplifier is limited to the maximum value of the maximum admissible slope for said word voltage signal.

14. The programming circuit of claim 8, further comprising a limiter circuit connected between said charge pump circuit and said program voltage reference.

15. The programming circuit of claim 14, wherein said limiter circuit comprises:
- a transistor connected between said charge pump circuit and said program voltage reference; and
- an additional operational amplifier having a first input terminal connected to said program voltage reference, a second input terminal connected to a second fixed external voltage reference, and an output terminal connected to a gate terminal of said transistor.

16. The programming circuit of claim 10, wherein said equalization voltages have the following values:

VE0=2.5V VE1=5.5V VE2=7.5V.

17. The programming circuit of claim 8, wherein said selectable voltages have the following values:

VS0=5.5V VS1=6.5V VS2=7.5V.

18. The programming circuit of claim 8, wherein said operational amplifier has another input terminal connected to an output terminal of said charge pump circuit whereat a charge pump voltage signal is provided to stabilize said program voltage reference.

19. The programming circuit of claim 8, wherein said operational amplifier is an integrator type.

20. The programming circuit of claim 19, wherein said operational amplifier has an input terminal arranged to receive said charge pump voltage signal and connected, through first and second cascaded amplifiers, to a control terminal of a transistor, in turn connected between a program voltage reference and an output terminal of said operational amplifier.

21. The programming circuit of claim 20, wherein said first amplifier has a first input terminal connected to a fixed voltage reference, a second input terminal connected to said input terminal of said operational amplifier, and an output terminal connected to a first generator of a first reference current, and to a first input terminal of said second amplifier through a first switch.

22. The programming circuit of claim 20, wherein said second amplifier has a second input terminal connected to an internal voltage reference, and an output terminal connected to said control terminal of said transistor.

23. The programming circuit of claim 20, wherein said output terminal of said operational amplifier is also connected to a second generator of a second reference current.

24. The programming circuit of claim 21, wherein said operational amplifier further comprises an internal capacitive element, feedback connected between an output terminal and said first input terminal of said second amplifier, said internal capacitive element having one end connected to said first input terminal of said second amplifier and to said internal voltage reference through a second switch, and having the other end connected to said output terminal of said second amplifier and to a program startup reference through a third switch.

25. The programming circuit of claim 20, wherein said second amplifier is a charge integrating type and generates, on its output terminal, a voltage ramp starting from a value which is equal to said program startup reference (and set in such a way that said word voltage signal generated on said output terminal of said operational amplifier equals a predetermined value.

26. The programming circuit of claim 25, wherein said second amplifier integrates an integrated current value given as the sum of said first reference current plus an output current from said first amplifier, so that the slope of said voltage ramp has properly controlled maximum and minimum values.

27. A method for programming a plurality of memory cells connected in parallel between first and second supply references and having their gate terminals connected together and also connected through a decoder to an output terminal of an operational amplifier configured to generate a word voltage signal, the method comprising:
- forming a program loop that includes the cells to be programmed, the operational amplifier, and a charge pump circuit; and
- generating a voltage from the charge pump circuit, the voltage having a voltage ramp with a slope that is a function of a voltage demand from the cells to be programmed.

28. A method of programming a plurality of cells connected in parallel between first and second supply references and having their gate terminals connected together and also connected through a decoder to an output terminal of an operational amplifier adapted to generate a voltage signal, the first voltage reference generated by a charge pump circuit that forms a program loop to include the cells to be programmed and the operational amplifier, the method comprising:

selecting the cells to be programmed;

outputting from the charge pump a voltage having a voltage ramp with a slope that is a function of a voltage demand from the cells to be programmed;

generating an interrupt signal to the charge pump in response to a comparison of the word voltage signal with a first selectable voltage reference;

verifying the programming of the cells to be programmed; and selecting further cells to be programmed and repeating the outputting the equalization voltage, the generating of the interrupt signal, and the verifying the programming to exhaustion of the cells to be programmed.

29. A circuit for programming a plurality of memory cells connected through a column decoder to a program voltage reference provided by a charge pump circuit and further connected to a second voltage reference, the plurality of memory cells having gate terminals sharing a connection to a word line, the circuit comprising:

an operational amplifier having at least one input terminal connected to an external voltage reference and an output terminal connected through a row decoder to the word line to provide a word voltage signal, the operational amplifier connected with the plurality of memory cells in a program loop arranged to adjust the slope of an output voltage ramp from the charge pump circuit to meet the demand from the plurality of memory cells to be programmed; and a limiter circuit connected between the charge pump circuit and the program voltage reference, the limiter circuit comprising a transistor connected between the charge pump circuit and the program voltage reference, and an additional operational amplifier having a first input terminal connected to the program voltage reference, a second input terminal connected to a second fixed external voltage reference, and an output terminal connected to a gate terminal of the transistor.

30. A circuit for programming a plurality of memory cells connected through a column decoder to a program voltage reference provided by a charge pump circuit, and further connected to a second voltage reference, the plurality of memory cells having cell gate terminals sharing a connection to a word line, the circuit comprising:

an operational amplifier having at least one input terminal connected to an external voltage reference and an output terminal connected through a row decoder to the word line to provide a voltage signal, the operational amplifier connected to the plurality of memory cells in a program loop arranged to adjust the slope of an output voltage from the charge pump circuit to meet the demand from the plurality of memory cells, the operational amplifier comprising an integrator type operational amplifier having an input terminal arranged to receive the charge pump voltage signal and connected through first and second cascaded amplifiers to a control terminal of a transistor that in turn is connected between the program voltage reference and an output terminal of the operational amplifier.

* * * * *